United States Patent
Hayashishita et al.

(10) Patent No.: US 11,251,062 B2
(45) Date of Patent: Feb. 15, 2022

(54) COMPONENT-MANUFACTURING FILM, COMPONENT-MANUFACTURING TOOL, AND COMPONENT-MANUFACTURING METHOD

(71) Applicant: Mitsui Chemicals Tohcello, Inc., Tokyo (JP)

(72) Inventors: Eiji Hayashishita, Nagoya (JP); Hirokazu Takahashi, Tokyo (JP); Kazuhide Fukura, Tokyo (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 61 days.

(21) Appl. No.: 16/481,618

(22) PCT Filed: Jan. 26, 2018

(86) PCT No.: PCT/JP2018/002585
§ 371 (c)(1),
(2) Date: Jul. 29, 2019

(87) PCT Pub. No.: WO2018/139612
PCT Pub. Date: Aug. 2, 2018

(65) Prior Publication Data
US 2019/0371645 A1  Dec. 5, 2019

(30) Foreign Application Priority Data
Jan. 30, 2017 (JP) .............................. JP2017-014808

(51) Int. Cl.
*H01L 23/52* (2006.01)
*H01L 21/683* (2006.01)
(Continued)

(52) U.S. Cl.
CPC ............ *H01L 21/6836* (2013.01); *B32B 7/12* (2013.01); *B32B 15/09* (2013.01); *B32B 15/18* (2013.01);
(Continued)

(58) Field of Classification Search
None
See application file for complete search history.

(56) References Cited

U.S. PATENT DOCUMENTS 5,605,844 A   2/1997   Oki et al.
6,171,163 B1  1/2001   Seko et al.
(Continued)

FOREIGN PATENT DOCUMENTS

JP   H08330372 A   12/1996
JP   H11111162 A   4/1999
(Continued)

OTHER PUBLICATIONS

International Search Report (with English translation) and Written Opinion issued in corresponding International Patent Application No. PCT/JP2018/002585, 8 pages (dated Mar. 27, 2018).
(Continued)

*Primary Examiner* — Joseph C. Nicely
*Assistant Examiner* — Lamont B Koo
(74) *Attorney, Agent, or Firm* — Buchanan, Ingersoll & Rooney PC

(57) ABSTRACT

Provided is a component-manufacturing film that includes a first region S1 and a second region S2 disposed so as to surround the region S1; the region S1 is formed of a base layer and an adhesive layer provided on one surface side of the base layer; the region S2 is formed of the base layer, the adhesive layer, and an additional layer affixed onto the layer. In the temperature range of 190° C. or lower, a tensile elastic modulus of the additional layer is equal to or greater than the
(Continued)

tensile elastic modulus of the base layer. Further provided are a component-manufacturing tool and method, the latter including a component fixing step; a film placement step of performing placement so that the boundary between the region S1 and the region S2 is located inside with respect to an edge of the chuck table; a chucking step; and a heating step.

8 Claims, 7 Drawing Sheets

(51) Int. Cl.
    *C09J 7/25*     (2018.01)
    *C09J 7/30*     (2018.01)
    *B32B 7/12*     (2006.01)
    *B32B 15/09*     (2006.01)
    *B32B 15/18*     (2006.01)
    *B32B 27/08*     (2006.01)
    *B32B 27/36*     (2006.01)

(52) U.S. Cl.
    CPC .............. *B32B 27/08* (2013.01); *B32B 27/36* (2013.01); *C09J 7/255* (2018.01); *C09J 7/30* (2018.01); *B32B 2457/00* (2013.01); *C09J 2433/00* (2013.01); *C09J 2467/006* (2013.01); *H01L 2221/68336* (2013.01)

(56) References Cited

U.S. PATENT DOCUMENTS

| | | | |
|---|---|---|---|
| 8,207,616 | B2 | 6/2012 | Hong et al. |
| 2010/0289158 | A1 | 11/2010 | Hong et al. |
| 2014/0132375 | A1* | 5/2014 | Sawaguchi ............ H02K 33/02 335/274 |
| 2015/0017375 | A1* | 1/2015 | Aoyama ................ C09J 133/08 428/41.8 |
| 2018/0142130 | A1 | 5/2018 | Hayashishita |

FOREIGN PATENT DOCUMENTS

| | | |
|---|---|---|
| JP | 2004217793 A | 8/2004 |
| JP | 2007005436 A | 1/2007 |
| JP | 2016032061 A | 3/2016 |
| TW | I532812 B | 5/2016 |
| WO | 2016125683 A1 | 8/2016 |
| WO | 2017002610 A1 | 1/2017 |

OTHER PUBLICATIONS

Extended European Search Report dated Oct. 22, 2020, by the European Patent Office in corresponding European Application No. 18744191.0-1211 (8 pages).
Notification of Reason for Refusal dated Oct. 29, 2020, by the Korean Patent Office in Korean Patent Application No. 10-2019-7022478 and an English translation of the Notification. (12 pages).
Notice of Reasons for Refusal dated Aug. 24, 2021, by the Japanese Patent Office in corresponding Japanese Patent Application No. 2018-564669, and an English translation of the Notice. (8 pages).
Office Action dated Apr. 15, 2021, by the Taiwanese Patent Office in corresponding Taiwanese Patent Application No. 107103045 and an English translation of the Action. (11 pages).
Notice of Final Rejection dated Jun. 25, 2021, by the Korean Patent Office in corresponding Korean Patent Application No. 10-2019-7022478, and an English translation of the Notice. (7 pages).
Notification of Letter of Review Opinion dated Nov. 22, 2021, by the Intellectual Property Office, Ministry of Economic Affairs, Taiwan in corresponding Taiwanese Patent Application No. 107103045 and an English translation of the Notification. (11 pages).

\* cited by examiner

COMPONENT-MANUFACTURING FILM, COMPONENT-MANUFACTURING TOOL, AND COMPONENT-MANUFACTURING METHOD

TECHNICAL FIELD

The present invention relates to a component-manufacturing film, a component-manufacturing tool, and a component-manufacturing method. More specifically, the present invention relates to a component-manufacturing film used for semiconductor component manufacturing, a component-manufacturing tool using this component-manufacturing film, a component-manufacturing method of manufacturing a semiconductor component, a component-manufacturing film used for electronic component-manufacturing, a component-manufacturing tool using this component-manufacturing film, and a component-manufacturing method of manufacturing an electronic component.

BACKGROUND ART

In recent years, there is known a method of manufacturing a semiconductor component in which a wafer on which circuits are formed is divided, then the divided semiconductor components are inspected, and only semiconductor components that has passed the inspection are picked up and sent to subsequent steps. This manufacturing method is disclosed, for example, in Patent Literature 1 below (see claim 1 and the like).

Generally, semiconductor components are manufactured by being integrally formed on a single semiconductor wafer and then being divided. However, since there are individual elements with initial defects, by using the method of Patent Literature 1, it is possible to improve the yield of final products without bringing an individual element which has risk of initial failure into subsequent steps.

CITATIONS LIST

Patent Literature

Patent Literature 1: JP 08-330372 A
Patent Literature 2: JP 2007-005436 A

SUMMARY OF INVENTION

Technical Problems

In order to use the above method, it is necessary to carry out three steps of dicing (dividing), inspection and pickup. At this time, although components such as a semiconductor wafer and a semiconductor component (obtained by dividing a semiconductor wafer) are processed in a state of being disposed on a carrier (affixing sheet, jig, or the like), performance required for the carrier in each step differs. For this reason, conventionally, it is necessary to transfer components on a carrier as needed for each step, which leads to complication and an increase in cost.

In the above Patent Literature 1, this problem is intended to be solved by using a stretchable sheet. However, "stretchability" assumed in Patent Literature 1 is thermal stretchability. That is, it is intended to eliminate displacement between an inspection electrode pad 111 and a bump 103 (see Patent Literature 1 [FIG. 15]) due to difference in thermal expansion by thermally shrinking the sheet in advance, so that a room for subsequent expansion is formed. Therefore, the stretch amount assumed in Patent Literature 1 is an extremely small shift amount which is about the thermal expansion amount of a contactor (material having a great thermal expansion amount is not intentionally used). A sheet having such a heat-stretching property is poor in dynamic stretchability obtained with application of force, and an elongation amount suitable for expansion in a pickup step cannot be obtained. Therefore, although the pickup step is described in Patent Literature 1 (Patent Literature 1 [FIG. 2](c)), when it is intended to carry out steps up to the pickup step using the assumed stretchable sheet, the mechanical stretch amount of the sheet is insufficient and pickup performance is significantly reduced. In contrast, since a sheet excellent in mechanical stretchability has great thermal expansion amount, the thermal expansion amount of the stretchable sheet becomes excessive to the thermal expansion amount of the contactor, and eventually, displacement between the inspection electrode pad 111 and the bump 103 cannot be eliminated. As described above, it can be said that it is extremely difficult to adjust a carrier that can be shared in the three steps of dicing, inspection, and pickup by matching the difference in thermal expansion between members.

In contrast, it is known that a dicing film disclosed in the above Patent Literature 2 can be used as a carrier in the dicing step and the pickup step among the above steps. The dicing step is a step of dividing a semiconductor wafer in a state of being affixed to a dicing film to obtain semiconductor components, and the pickup step is a step of stretching out the dicing film to form a gap between the divided semiconductor components and picking up the semiconductor components. Therefore, the dicing film has mechanical strength enough to withstand dicing and flexibility (dynamic stretchability) enough to be able to be stretched out to such an extent that a gap can be formed between components.

In contrast, although the above-described inspection step may include various individual steps, and particularly includes inspections using heat application such as operation confirmation under heated environment and acceleration evaluation using a heat stress load. Therefore, in addition to the mechanical strength and flexibility required in the above-described dicing step and pickup step, the carrier is also required to have heat resistance; however, examination on this point has not been made in Patent Literature 2.

The present inventors examined various materials from the above-described viewpoints, and repeated tests to select a material which can balance more required characteristics. Then, it has been found that selecting a material flexible to such an extent that a gap can be formed between components (pickup step) may cause a problem that a component-manufacturing film cannot be fixed to a chuck table. That is, when a component-manufacturing film is to be fixed to the chuck table in a state where heat corresponding to that upon inspection is applied, even a component-manufacturing film fixed to a frame body cannot be normally chucked on the chuck table due to a wrinkle generated in the frame body.

The present invention has been made in view of the above problems, and the purpose of the present invention is to provide a component-manufacturing film with which reliable chucking to a chuck table is possible in a heated environment while having a property of being commonly used in this field enabling shared use in different steps, a component-manufacturing tool using this component-manufacturing film, and component-manufacturing methods using these component-manufacturing film and component-manufacturing tool.

Solutions to Problems

That is, the present invention is as follows.

[1] A component-manufacturing film according to claim 1 is a component-manufacturing film used in a method of manufacturing a semiconductor component or a method of manufacturing an electronic component, the component-manufacturing film including:

a first region; and a second region disposed so as to surround the first region, in which the first region is formed of a base layer and an adhesive layer provided on one surface side of the base layer, in which the second region is formed of the base layer, the adhesive layer, and an additional layer affixed onto the adhesive layer, and in which in a temperature range of 190° C. or lower, a tensile elastic modulus of the additional layer is equal to a tensile elastic modulus of the base layer or greater than the tensile elastic modulus of the base layer.

[2] The component-manufacturing film according to claim 2 is the component-manufacturing film according to claim 1, in which a linear thermal expansion coefficient of the base layer is 100 ppm/K or more.

[3] The component-manufacturing film according to claim 3 is the component-manufacturing film according to claim 1 or 2, in which the base layer includes at least one of a thermoplastic polyester-based elastomer, a thermoplastic polyamide-based elastomer, and polybutylene terephthalate.

[4] The component-manufacturing film according to claim 4 is the component-manufacturing film according to any one of claims 1 to 3, in which the additional layer is made of one or two or more materials selected from the group consisting of metal, resin, ceramics, and glass.

[5] The component-manufacturing film according to claim 5 is the component-manufacturing film according to any one of claims 1 to 4 further having a third region disposed so as to surround the second region, the third region being formed of the base layer and the adhesive layer.

[6] A component-manufacturing tool according to claim 6 is a component-manufacturing tool used in a method of manufacturing a semiconductor component or a method of manufacturing an electronic component, the component-manufacturing tool including:

a frame body having an opening and the component-manufacturing film according to any one of claims 1 to 5, in which the component-manufacturing film is fixed to the frame body so that the component-manufacturing film covers the opening and a boundary between the first region and the second region is located inside the opening.

[7] A component-manufacturing method according to claim 7 is a method of manufacturing a component selected from a semiconductor component and an electronic component, the method including:

a component fixing step of fixing the component in the first region of the component-manufacturing film according to any one of claims 1 to 5;

a film placement step of placing the component-manufacturing film to which the component is fixed on a chuck table so that a boundary between the first region and the second region is located inside with respect to an edge of a chuck table;

a chucking step of chucking the component-manufacturing film to which the component is fixed on a surface of the chuck table and fixing the component-manufacturing film; and a heating step of heating the component on the component-manufacturing film from a side of the chuck table through the component-manufacturing film fixed on the chuck table.

[8] A component-manufacturing method according to claim 8 is a method of manufacturing a component selected from a semiconductor component and an electronic component, the method including:

a component fixing step of fixing the component in the first region of the component-manufacturing film exposed from the opening of the component-manufacturing tool according to claim 6;

a film placement step of placing the component-manufacturing tool to which the component is fixed on a chuck table so that a boundary between the first region and the second region is located inside with respect to an edge of the chuck table;

a chucking step of chucking the component-manufacturing film to which the component is fixed on a surface of the chuck table and fixing the component-manufacturing film; and a heating step of heating the component on the component-manufacturing film from a side of the chuck table through the component-manufacturing film fixed on the chuck table.

Advantageous Effects of Invention

According to the present component-manufacturing film and the present component-manufacturing tool, the component-manufacturing film can be reliably chucked on a chuck table in a heated environment while having a property of being commonly used in this field enabling shared use in different steps.

For this reason, an inspection including the heating step can be performed while fixing the component-manufacturing film on the chuck table, it is not necessary to replace carriers before and after the inspection, and therefore it is possible to efficiently manufacture components. In particular, the present component-manufacturing film and the present component-manufacturing tool enable sharing of the carrier in a plurality of steps including dicing, inspection, and pickup steps.

According to the present first component-manufacturing method using the present component-manufacturing film and the present second component-manufacturing method using the present component-manufacturing tool, the component-manufacturing film can be reliably chucked on the chuck table in a heated environment while having a property of being commonly used in this field enabling shared use in different steps.

For this reason, an inspection including the heating step can be performed while fixing the component-manufacturing film on the chuck table, it is not necessary to replace carriers before and after the inspection, and therefore it is possible to efficiently manufacture components. In particular, the present component-manufacturing film and the present component-manufacturing tool enable sharing of the carrier in a plurality of steps including dicing, inspection, and pickup steps.

DESCRIPTION OF EMBODIMENTS

Hereinafter, the present invention will be described with reference to the drawings. Matters indicated here are illustrative and for illustratively explaining embodiments of the present invention, and are described for the purpose of providing explanation which seems to be most effective and easiest for understanding of the principle and conceptual features of the present invention. In this respect, it is not intended to present the structural details of the present invention to a certain degree or more necessary for a fundamental understanding of the present invention and it is intended to clearly teach those skilled in the art how some modes of the present invention are actually embodied by using explanation in combination with the drawings.

[1] Component-Manufacturing Film

A component-manufacturing film (1) according to the present invention is a film used in a method of manufacturing a semiconductor component or a method of manufacturing an electronic component. That is, the component-manufacturing film (1) according to the present invention includes a semiconductor component-manufacturing film (1) and an electronic component-manufacturing film (1).

Figure 1:
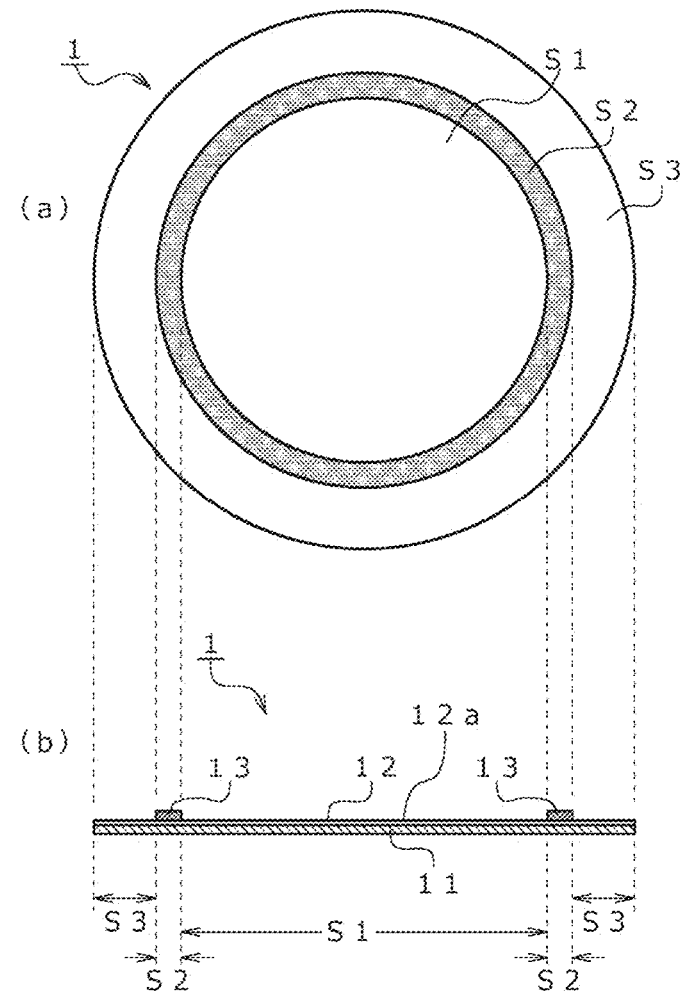
FIG. 1 is an explanatory view for explaining a planar form (a) and a corresponding sectional form (b) of an example of a present component-manufacturing film.
Figure 2:
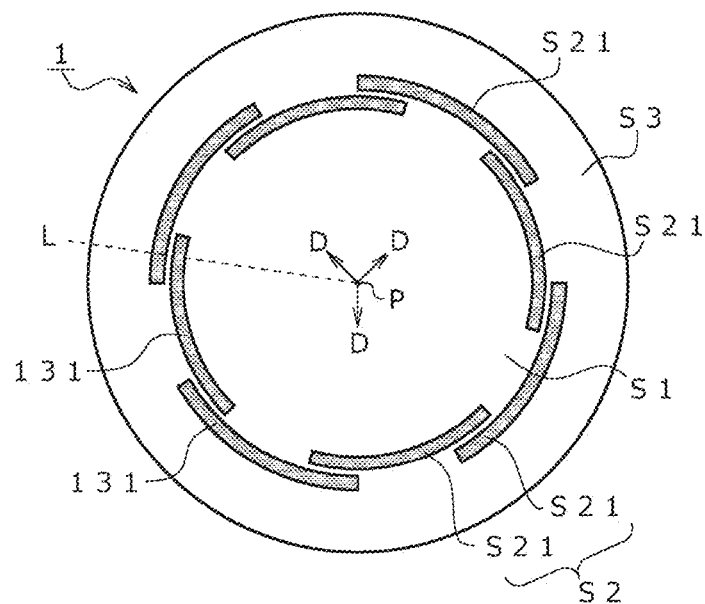
FIG. 2 is explanatory view for explaining a planar form of another example of the present component-manufacturing film.
Figure 3:
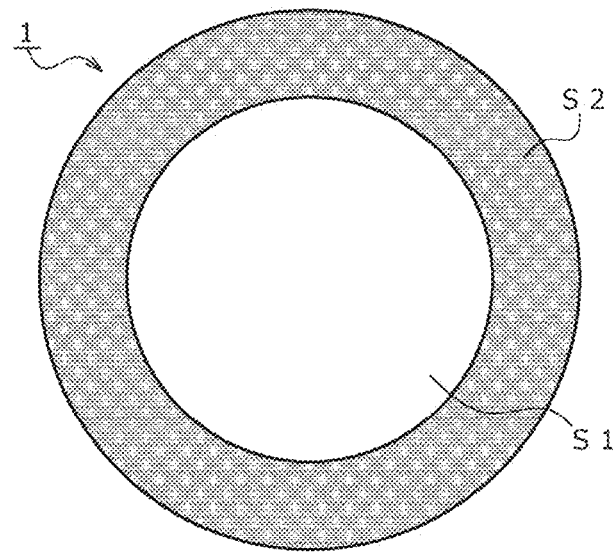
FIG. 3 is an explanatory view for explaining a planar form of yet another example of the present component-manufacturing film.

This component-manufacturing film (1) has a first region (S1) and a second region (S2) disposed so as to surround the first region (S1) (see FIGS. 1 to 3).

Then, the first region (S1) is formed of a base layer (11) and an adhesive layer (12) provided on one surface (11a) side of the base layer (11) (see FIG. 1).

In contrast, the second region (S2) is formed of the base layer (11), the adhesive layer (12), and an additional layer (13) affixed onto the adhesive layer (12) (see FIG. 1).

Furthermore, in the temperature range of 190° C. or lower, the tensile elastic modulus of the additional layer (13) is set to be equal to the tensile elastic modulus of the base layer (11) or greater than the tensile elastic modulus of the base layer (11).

Due to this configuration, the present component-manufacturing film 1 can reliably chuck the component-manufacturing film (1) on a chuck table in a heated environment while having a property of being commonly used in this field enabling shared use in different steps.

If the above configuration is rephrased, the component-manufacturing film 1 includes three layers, that is, the base layer 11, the adhesive layer 12 laminated on the one surface 11a side of the base layer 11, and the additional layer 13 laminated on part of a front surface (one surface) 12a of the adhesive layer 12 located opposite to the base layer 11 out of the front and back surfaces of the adhesive layer 12 (see FIG. 1). Then, the component-manufacturing film 1 has the second region S2 disposed so as to surround the first region S1 in plan view, the first region S1 includes only the base layer 11 and the adhesive layer 12, and the second region S2 includes all the three layers.

Note that it is sufficient that the adhesive layer 12 is provided only on the one surface 11a side of the base layer 11; however, may be provided on both the one surface 11a side and the other surface 11b side of the base layer 11 if necessary. In addition, the base layer 11 and the adhesive layer 12 may be in direct contact with each other or another layer may be interposed therebetween. Similarly, the adhesive layer 12 and the additional layer 13 may be in direct contact with each other or another layer may be interposed therebetween.

(1) Regarding Each Region

The present component-manufacturing film 1 has the first region S1 and the second region S2, and the first region S1 is the region surrounded by the second region S2 (see FIGS. 1 to 3).

Figure 5:
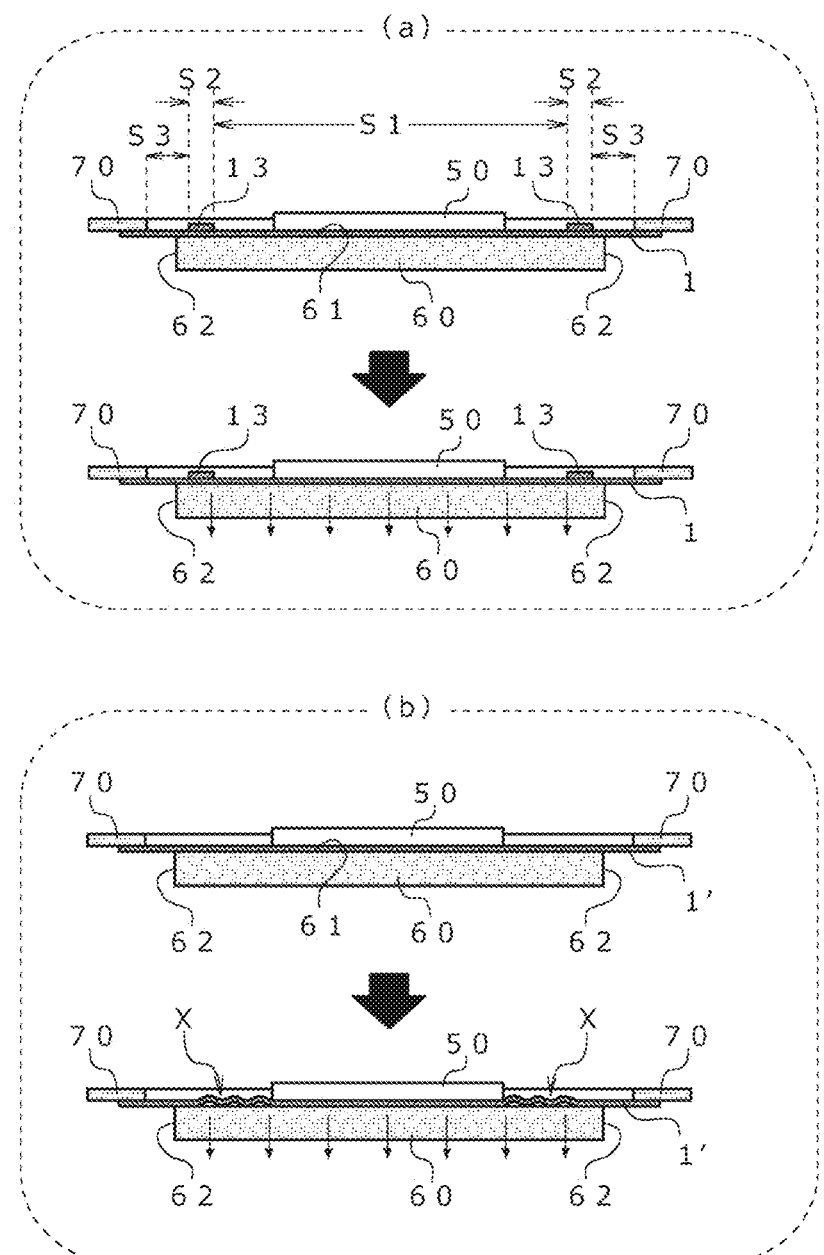
FIG. 5 is an explanatory view for explaining the difference between effect (a) of the present component-manufacturing film and effect (b) of a conventional component-manufacturing film.

If chucking of a component-manufacturing film 1' not including a second region S2 as in a conventional component-manufacturing film 1' is to be performed, there may be a case where a wrinkle X is generated, suction failure occurs, and the component-manufacturing film 1' cannot be normally chucked and fixed on a chuck table due to adaptive incompatibility of material selection of the base layer, the temperature condition of a surface of the chuck table, or the like (See FIG. 5(b)).

In contrast, as described above, the present component-manufacturing film 1 including the second region S2 surrounding the first region S1 can be normally sucked and fixed on a surface 61 of a chuck table 60. In particular, even in a case of selecting a flexible material as the base layer 11 and furthermore chucking is performed on the heated chuck table 60, the component-manufacturing film 1 can be normally chucked and fixed on the surface 61 of the chuck table 60 without causing chucking failure.

Although the mechanism of enabling chucking due to provision of the second region S2 is not clear, it is considered that by surrounding the first region S1 with the additional layer 13 having the tensile elastic modulus when heated is equal to that of the base layer 11 or greater than that of the base layer 11, the second region S2 can function as a chucking start point. That is, it can be considered that by surrounding the first region S1 with the second region S2 in which a decrease in elasticity when heated is relatively lower, the second region S2 is first chucked normally, suction failure from the first region S1 surrounded by this second region S2 is prevented, and thus the first region S1 can also be chucked normally.

Usually, the shape of the above-described second region S2 corresponds to the shape of the additional layer 13. Therefore, the outer peripheral shape of the first region S1 (which is the approximate shape of the first region S1 and corresponds to the inner peripheral shape of the second region S2), the inner peripheral shape of the second region S2, the outer peripheral shape of the second region S2, and the like can be determined by the shape of the additional layer 13.

As described above, since the shape and size of the first region S1 can be designed by the additional layer 13, the present component-manufacturing film 1 is suitable, for example, in a case where a region where a component is placed is smaller than usual with respect to entirety of the component-manufacturing film 1 or a case where it is necessary to place components having various sizes and forms (case where the present component-manufacturing film 1 is used in common for manufacturing components having various sizes, a case where it is necessary to place components having different sizes for each lot, or the like). That is, by affixing the additional layer 13 having an appropriate shape and size in accordance with the shape and size of a placement region (that is, the first region S1) onto the adhesive layer 12, the optimum first region S1 can be set.

As the approximate shape of the present component-manufacturing film 1, for example, the forms of FIGS. 1 to 3 are illustrated as examples.

The second region S2 illustrated in FIG. 1 exhibits a continuous ring shape. That is, the component-manufacturing film 1 illustrated in FIG. 1 includes the additional layer 13 having a continuous ring shape. In the additional layer 13 of FIG. 1, the outer peripheral shape and the inner peripheral shape of the second region S2 are similar circular shapes. As described above, the outer peripheral shape and the inner peripheral shape of the second region S2 may be correlated or not be correlated. That is, the outer peripheral shape and inner peripheral shape of the second region S2 can be correlated shapes, that is, similar circular shapes. In contrast, for example, in a case where the outer peripheral shape of the second region S2 is a square and the inner peripheral shape of the second region S2 is a circular shape, the outer peripheral shape and the inner peripheral shape are not correlated with each other; however, even such shapes enable effect of the present invention to be exhibited.

In addition, the present component-manufacturing film 1 may have only one first region S1 (see FIG. 1) or may have two or more first regions S1 in one component-manufacturing film 1. Similarly, only one second region S2 may be provided (see FIG. 1) or two or more second regions S2 may be provided in one present component-manufacturing film 1.

In addition, the additional layer 13 may be in a state of being more firmly joined to the adhesive layer 12 by using means other than an adhesive constituting the adhesive layer 12, or may be in a state where the additional layer 13 is simply affixed to the adhesive layer 12. The present component-manufacturing film 1 can function in either state.

Furthermore, the present component-manufacturing film 1 may be in the form of having only the first region S1 and the second region S2 described above, or may be in the form of further including another region.

The form of having only the first region S1 and the second region S2 is illustrated in FIG. 3. That is, it is possible to make the component-manufacturing film 1 in which the entire region outside the outer periphery of the first region S1 and extending to the outer edge of the component-manufacturing film 1 is the second region S2.

In contrast, the component-manufacturing film 1 in FIGS. 1 and 2 is illustrated as an example of the form including a region other than the first region S1 and the second region S2. That is, in addition to the first region S1 and the second region S2, the third region S3 formed of the base layer 11 and the adhesive layer 12 and disposed so as to surround the second region S2 can be provided.

As described above, in the case where the third region S3 is provided, pickup performance can be improved.

The present component-manufacturing film 1 is disposed on the chuck table 60 so that an edge 62 of the chuck table 60 is disposed inside with respect to the outer edge of the second region S2. Therefore, the component-manufacturing film 1 can be chucked and fixed on the surface 61 of the chuck table without causing chucking failure.

Further, in the case where the third region S3 is provided outside with respect to the second region S2, the component-manufacturing film 1 can be spread and pulled by positioning the outer edge of the component-manufacturing film 1, for example, below the chuck table 60. As a result, the first region S1 can be uniformly expanded, a gap can be formed between components (diced components) placed in the first region S1, and each component can be easily picked up.

In addition, in FIG. 2, a plurality of arc-shaped (fan-shaped) individual regions S21 forms a second region S2 as a whole and surrounds a first region S1. That is, in a component-manufacturing film 1 illustrated in FIG. 2, a plurality of arc-shaped (fan-shaped) individual additional layers 131 form an additional layer 13 as a whole. In addition, in FIG. 2, the individual regions S21 each have an arc shape; however may have identical shapes or may have different shapes. The shape of the individual region S21 is not limited to the arc shape, and for example, the second region S2 can be similarly formed of a rectangular individual region S21.

Furthermore, the number of individual regions S21 constituting the second region S2 is not limited, and the second region S2 can be formed of two or more individual regions S21 (usually, 50 or less). In addition, similarly to the case of FIG. 1, the outer peripheral shape and the inner peripheral shape of each of the individual regions S21 in FIG. 2 may be correlated or may not be correlated.

As described above, in a form where the plurality of individual regions S21 form the second region S2 as a whole and surrounds the first region S1, the individual regions S21 are preferably disposed so that in a case of drawing virtual lines L from the center P of the first region S1 (which can be the rotation center) in centrifugal directions, virtual lines L in all centrifugal directions D intersect with any of the individual regions 521. Therefore, as illustrated in FIG. 2, the arc-shaped individual regions S21 are preferably disposed so as to partially overlap with each other in the centrifugal direction D so that each circular arc which is the individual region S21 is prevented from passing through from the center P in the centrifugal direction D (see FIG. 2).

(2) Base Layer

It is sufficient that the base layer 11 can support the adhesive layer 12 and the additional layer 13, and the material constituting the base layer 11 is not specifically limited.

As the material which constitutes the base layer 11, a resin is preferable. Further, among resins, a resin having sufficient flexibility (dynamic stretchability) is preferable so as to be able to be shared among more different steps such as a dicing step, a pickup step, an inspection step, and the like, and a resin which has an elastomeric property is particularly preferable.

Examples of the resin having an elastomeric property include thermoplastic elastomers and silicones. One of them may be used or two or more of them may be used in combination. Among them, a thermoplastic elastomer is preferable because one having thermoplasticity is preferable. A thermoplastic elastomer may be a block copolymer having a hard segment and a soft segment, may be a polymer alloy of a hard polymer and a soft polymer, or may have properties of both of them.

In the case of including a thermoplastic elastomer, the proportion thereof can be, for example, 30% by mass or more and 100% by mass or less with respect to the entire resin constituting the base layer 11. That is, the resin constituting the base layer 11 may be made only of a thermoplastic elastomer. The proportion of the thermoplastic elastomer is further preferably 50% by mass or more to 100% by mass or less, and more preferably 70% by mass or more to 100% by mass or less.

Specifically, examples of the thermoplastic elastomer include a polyester-based thermoplastic elastomer, a polyamide-based thermoplastic elastomer, a styrene-based thermoplastic elastomer, an olefin-based thermoplastic elastomer, a vinyl chloride-based thermoplastic elastomer, and a polyimide-based thermoplastic elastomer (polyimide ester-based, polyimide urethane-based, and the like). One of them may be used or two or more of them may be used in combination.

Among them, a polyester-based thermoplastic elastomer, a polyamide-based thermoplastic elastomer, and a polyimide-based thermoplastic elastomer are preferable, and furthermore, a polyester-based thermoplastic elastomer and/or a polyamide-based thermoplastic elastomer are particularly preferable.

The polyester-based thermoplastic elastomer may have any configuration except that a polyester component is a hard segment. As a soft segment, a polyester, a polyether, a polyether ester, and the like can be used. One of them may be used or two or more of them may be used in combination. That is, for example, as a polyester component constituting the hard segment, a structural unit derived from a monomer such as dimethyl terephthalate can be included. In contrast, a structural unit derived from a monomer such as 1,4-butanediol and poly(oxytetramethylene) glycol can be included as the component constituting the soft segment.

More specifically, a PBT-PE-PBT polyester-based thermoplastic elastomer or the like can be indicated as an example.

Examples of such a polyester-based thermoplastic elastomer include "Primalloy (trade name)" manufactured by Mitsui Chemicals, Inc., "Hytrel (trade name)" manufactured by Du pont-Toray Co., Ltd., "Pelpren (trade name)" manufactured by Toyobo Co., Ltd., "Hyper alloy actimer (trade name)" manufactured by Riken Technos corp., and the like. One of them may be used or two or more of them may be used in combination.

The polyamide-based thermoplastic elastomer may have any configuration except that a polyamide component is a hard segment. As a soft segment, a polyester, a polyether, a polyether ester, and the like can be used. One of them may be used or two or more of them may be used in combination. That is, for example, examples of the polyamide component constituting the hard segment include polyamide 6, polyamide 11, polyamide 12, and the like. One of them may be used or two or more of them may be used in combination.

Various lactams and the like can be used as monomers in these polyamide components. In contrast, as a component constituting a soft segment, the structural unit derived from a monomer such as dicarboxylic acid or polyether polyol can be included. Among them, as polyether polyol, polyether diol is preferable, and for example, examples of polyether polyol include poly(tetramethylene) glycol, poly(oxypropylene) glycol and the like. One of them may be used or two or more of them may be used in combination.

More specifically, a polyether amide-type polyamide-based thermoplastic elastomer, a polyester amide-type polyamide-based thermoplastic elastomer, a polyether ester amide-type polyamide-based thermoplastic elastomer, and the like can be indicated as an example.

Examples of such a polyamide-based thermoplastic elastomer include "Pebax (trade name)" manufactured by Arkema Inc., "Diamide (trade name)" manufactured by Daicel-Evonik Ltd., "Vestamide (trade name)" manufactured by Daicel Daicel-Evonik Ltd., "UBESTA XPA (trade name)" manufactured by Ube Industries, Ltd., and the like. One of them may be used or two or more of them may be used in combination.

In addition, in a case where the base layer 11 contains resin other than a thermoplastic elastomer, examples of such resin include polyesters, polyamides, polycarbonates, acrylic resins, and the like. One of them may be used or two or more of them may be used in combination. Among them, polyesters and/or polyamides are preferable, and specifically, polyesters such as polyethylene terephthalate, polybutylene terephthalate, polyethylene naphthalate and polybutylene naphthalate, and polyamides such as nylon 6 and nylon 12 can be indicated as an example.

Specifically, examples of polybutylene naphthalate include "Toraycon (trade name)" manufactured by Toray Industries, Inc. This polybutylene terephthalate can be used alone as the base layer 11.

Furthermore, the base layer 11 can contain, in the resin constituting the same, various additives such as a plasticizer and a softener (mineral oil or the like), a filler (carbonate, sulfate, titanate, silicate, oxide (titanium oxide, magnesium oxide), silica, talc, mica, clay, fiber filler, and the like), an antioxidant, a light stabilizer, an antistatic agent, a lubricant, a colorant, and the like. One of them may be used or two or more of them may be used in combination.

In addition, in the temperature range of 190° C. or lower, the tensile elastic modulus of the base layer 11 is set to be equal to that of the additional layer 13 or smaller than that of the additional layer 13. That is, the base layer 11 is such a layer that the tensile elastic modulus (hereinafter also simply referred to as "$E_{11}$'") of the base layer 11 at temperature of 190° C. or lower is equal to or smaller than the tensile elastic modulus (hereinafter also simply referred to as "$E_{13}$'") of the additional layer 13. That is, $E_{11}' \leq E_{13}'$.

By having the correlation ($E_{11}' \leq E_{13}'$) of the tensile elastic moduli, the component-manufacturing film 1 can be reliably chucked on the chuck table in a heated environment while having a property of being commonly used in this field enabling shared use in different steps.

The above correlation of $E_{11}' \leq E_{13}'$ is preferably established in a higher temperature range. From such a viewpoint, the correlation of $E_{11}' \leq E_{13}'$ is preferably established in the temperature range of 50° C. or higher and 190° C. or lower, is more preferably established in the temperature range of 70° C. or higher and 180° C. or lower, is further preferably established in a temperature range of 90° C. or higher and 170° C. or lower, and is particularly preferably established in a temperature range of 110° C. or higher and 160° C. or lower.

In addition, the effect of the present invention is great in the material having a smaller $E_{11}'$ at high temperature as the base layer 11. That is, as material with a smaller $E_{11}'$ at high temperature is used as the base layer 11, the aforementioned chucking failure is more likely to occur. For this reason, it can be said that by providing the additional layer 13 to form the second region S2, the effect of preventing chucking failure can be easily obtained. From such a viewpoint, in a temperature range in which $E_{11}$ is 90° C. or higher and 190° C. or lower (furthermore, in a temperature range of 110° C. or higher and 160° C. or lower), the base layer 11 in which $E_{11}' \leq 390$ MPa is preferable, the base layer 11 in which $0.1$ MPa$\leq E_{11}' \leq 570$ MPa is preferable, the base layer 11 in which $0.5$ MPa$\leq E_{11}' \leq 270$ MPa is further preferable, the base layer 11 in which $1$ MPa$\leq E_{11}' \leq 130$ MPa is further preferable, the base layer 11 in which $2$ MPa$\leq E_{11}' \leq 80$ MPa is further preferable, and the base layer 11 in which is $3$ MPa$\leq E_{11}' \leq 40$ MPa is further preferable.

In addition, as mentioned before, the tensile elastic modulus $E_{11}'$ and the tensile elastic modulus $E_{13}'$ may be equal ($E_{11}' = E_{13}'$); however, $E_{13}'$ is preferably greater than $E_{11}'$ ($E_{11}' \leq E_{13}'$). More specifically, in the temperature range of 90° C. or higher and 190° C. or lower (furthermore, in the temperature range of 110° C. or higher and 160° C. or lower), the ratio of $E_{11}'$ to $E_{13}'$ ($E_{13}'/E_{11}'$) is preferably ($E_{13}'/E_{11}'$)$\geq 1.5$ (usually, (E13'/E11')$\leq 17000$). In particular, in a case where the additional layer 13 is made of resin as described later, $1.5 \leq (E_{13}'/E_{11}') \leq 250$ is preferable, $1.8 \leq (E_{13}'/E_{11}') \leq 100$ is more preferable, and $2.2 \leq (E_{13}'/E_{11}') \leq 80$ is further preferable, and $2.5 \leq (E_{13}'/E_{11}') \leq 65$ is particularly preferable.

Furthermore, in a case where the tensile elastic modulus of the base layer 11 at temperature T(° C.) is $E_{11}'(T)$ (the same applies hereinafter) and the ratio of tensile elastic moduli $E_{11}'(160)$ and $E_{11}'(-40)$ "$E_{11}'(160)/E_{11}'(-40)$ is $R_{11}$, it is preferable that $E_{11}'(160) \leq 800$ MPa and $0.01 \leq R_{11} \leq 1$.

As a result, during component manufacturing, it is possible to pass through steps performed at each of a low temperature region of −40° C. or higher and 0° C. or lower and/or a high temperature region of 100° C. or higher and 190° C. or lower (particularly 160° C. or lower) and to maintain flexibility necessary in the pickup step. Therefore, it is possible to obtain the component-manufacturing film 1 used common in respective steps such as the heating step (for example, an evaluation step) accompanied by a temperature change, the dividing step (step of cutting a semiconductor wafer or arrayed electronic components or the like into pieces) and the pickup step. For this reason, there is no need to replace components on a dedicated component-manufacturing film for each step, and productivity is excellent.

In addition, since the heating step and other steps can be performed while the component-manufacturing film 1 remains to be affixed, any of these steps can be performed first, and degree of freedom of steps is more excellent than in a case of using a dedicated adhesive film, tray, or the like.

Furthermore, regarding this $R_{11}$, $0.01 \leq R_{11} \leq 0.5$ is preferable, $0.01 \leq R_{11} \leq 0.3$ is more preferable, $0.02 \leq R_{11} \leq 0.2$ is further preferable, and $0.02 \leq R_{11} \leq 0.1$ is particularly preferable.

When a component 50 (a semiconductor wafer 51, a semiconductor component 52, an array-shaped electronic component 53, an electronic component 54, or the like) in the present invention is manufactured, there are cases where temperature becomes low (for example, an evaluation step at low temperature). Since the tensile elastic modulus E' of the base layer 11 at low temperatures is greater than the tensile elastic modulus E' at high temperature, it is preferable to be able to maintain flexibility at low temperature in a case of going through such a step. However, material capable of achieving heat resistance at high temperature usually has high tensile elastic modulus at high temperature, and such material has greater tensile elastic modulus at low temperature. In this respect, the component-manufacturing film 1 in which the ratio $R_{11}$ of the base layer 11 is $R_{11} \geq 0.01$ and $E_{11}'(-40)$ satisfies 20 MPa$\leq E_{11}'(-40) \leq 4300$ MPa can be shared in each of the above-described situations that may occur during manufacturing of the component 50 according to the present invention.

Furthermore, $E_{11}'(-40)$ preferably satisfies the above correlation of $R_{11}$, and although a specific value of $E_{11}'(-40)$ alone is not limited, 80 MPa$\leq E_{11}'(-40) \leq 4000$ MPa is preferable, 120 MPa$\leq E_{11}'(-40) \leq 3800$ MPa is more preferable, 180 MPa$\leq E_{11}'(-40) \leq 2500$ MPa is further preferable, and 250 MPa$\leq E_{11}'(-40) \leq 1400$ MPa is particularly preferable.

Note that $E_{11}'$ described in the present Description is preferably in the range described in both the MD direction and the TD direction of the base layer 11.

The above each tensile elastic modulus $E_{11}'$ regarding the base layer 11 is measured by a dynamic viscoelasticity measuring device (DMA: Dynamic Mechanical Analysis). Specifically, the tensile elastic modulus $E_{11}'$ is obtained by reading data of each temperature from data obtained by measuring from −50° C. to 200° C. under the measurement conditions of a frequency of 1 Hz and a heating rate of 5° C./min with a sample size of 10 mm in width and the length between chucks of 20 mm.

Furthermore, the linear thermal expansion coefficient of the base layer 11 is not limited; however, is preferably 100 ppm/K or more. Examples of such material include thermoplastic elastomers as described above. That is, thermoplastic elastomers are material having a relatively great linear thermal expansion coefficient, and a great linear thermal expansion coefficient is considered to be a driving factor for causing deformation of a component-manufacturing film at high temperature. As described above, in the component-manufacturing film 1 in which a base layer having a linear thermal expansion coefficient of 100 ppm/K or more is used, a wrinkle or the like tends to be generated, so that chucking failure to the chuck table is likely to occur particularly in heated environment. In contrast, even in the case of using the base layer 11 having a linear thermal expansion coefficient of 100 ppm/K or more, by providing the second region S2 using the additional layer 13, chucking failure on the chuck table in heated environment can be prevented.

Furthermore, the configuration of the component-manufacturing film 1 according to the present invention is suitable in a case where the linear thermal expansion coefficient of the base layer 11 is 100 ppm/K or more and 300 ppm/K or less, and is further suitable in a case where the linear thermal expansion coefficient of the base layer 11 is 150 ppm/K or more and 250 ppm/K or less.

Note that a linear thermal expansion coefficient is measured according to JIS K7197, and is a thermal expansion coefficient at temperature of 50° C. to 190° C.

The thickness of the base layer 11 is not particularly limited, and can be, for example, 50 μm or more and 200 μm or less, preferably 65 μm or more and 175 μm or less, and more preferably 80 μm or more and 150 μm or less. In addition, the base layer 11 may or may not be stretched.

(3) Adhesive Layer

The adhesive layer 12 is a layer formed of an adhesive, and can be provided only on one surface of the base layer 11 or on both surfaces of the base layer 11. The adhesive layer 12 may be provided in direct contact with the base layer 11 or may be provided with another layer interposed therebetween.

The adhesive force of the adhesive layer 12 is not particularly limited; however, it is preferable that adhesive force with respect to a silicon wafer measured according to JIS Z0237 when the adhesive layer 12 is affixed to a surface of a silicon wafer and left for 60 minutes and then is peeled off from the surface of the silicon wafer (measured under environment where temperature is 23° C. and relative humidity is 50%) is 0.1 to 10N/25 mm. In a case where the adhesive force is in the above-described range, an adhesive residue to the component can be suppressed upon peeling while good adhesiveness with the component is secured. This adhesive force is further preferably 0.2 N/25 mm or more and 9 N/25 mm or less, and further preferably 0.3 N/25 mm or more and 8 N/25 mm or less.

In addition, the thickness of the adhesive layer 12 (thickness on the one surface side of the base layer 11) is not particularly limited; however, is preferably 1 μm or more and 40 μm or less, more preferably 2 μm or more and 35 μm or less, and particularly preferably 3 μm or more and 25 μm or less.

Any material may be used as the adhesive. Usually, the adhesive contains at least an adhesive main agent. Examples of the adhesive main agent include an acrylic adhesive, a silicone adhesive, a rubber adhesive, or the like. In addition, this adhesive can contain a crosslinking agent in addition to the adhesive main agent.

Furthermore, the adhesive may be an energy ray-curable adhesive that can be cured by energy rays, or an energy non-curable adhesive that is not cured by energy rays. In the case of the energy ray-curable adhesive, the adhesive can be cured by irradiating the adhesive with energy rays to reduce the adhesive force thereof, and an adhesive residue on the component 50 can be prevented when the present component-manufacturing film 1 and the component 50 are separated from each other. The type of energy rays is not limited, and ultraviolet rays, electron beams, infrared rays, or the like can be used.

In the case of the energy ray-curable adhesive, in addition to the above-described adhesive main agent, the adhesive can include a compound having a carbon-carbon double bond in a molecule and a photoinitiator which reacts with energy rays to initiate polymerization of a curable compound. This curable compound is preferably a monomer, an oligomer and/or a polymer having a carbon-carbon double bond in a molecule and curable by radical polymerization.

(4) Additional Layer

The additional layer 13 is a layer that forms the second region S2, and is a layer whose tensile elastic modulus (hereinafter, also simply referred to as "$E_{13}$") is equal to the tensile elastic modulus $E_{11}'$ of the base layer 11 or greater than the tensile elastic modulus of the base layer 11 in the temperature range of 190° C. or lower. That is, $E_{11}' \leq E_{13}'$. Any material satisfying $E_{11} \leq E_{11}'$ can be used without limitation as the additional layer 13. Specifically, the additional layer 13 may be an organic material, an inorganic material, or a composite material of them.

Among the above, examples of the organic material include various resins (resin film, resin ring, or the like), paper making material (paper making material or the like obtained by making paper from pulp, resin fibers, or the like), and the like. Among them, resins are preferable from the viewpoint of moldability, easiness of controlling physical properties, and the like.

In addition, examples of the resins include a thermoplastic resin, a thermosetting resin, and a thermoplastic elastomer. One of them may be used or two or more of them may be used in combination. Among them, a thermoplastic resin and a thermoplastic resin elastomer are preferable from the viewpoint of moldability.

Among the above, examples of the thermoplastic resin which can constitute the additional layer 13 include polyesters (polyethylene terephthalate, polybutylene terephthalate, polyethylene naphthalate, polybutylene naphthalate and the like), polyamides (nylon 6, nylon 12, and the like), polycarbonates, and acrylic resins, and the like. One of them may be used or two or more of them may be used in combination.

Among the above, as the thermoplastic elastomer which can constitute the additional layer 13, material which can constitute the base layer 11 can be applied as it is.

Since an inorganic material can be used as the additional layer 13 as mentioned before, for example, the additional layer 13 which becomes a weight (a metal ring or the like) for the component-manufacturing film 1 can also be used. However, if the additional layer 13 that can function as a weight is used, the weight thereof becomes a load on the component-manufacturing film 1, and thus the component-manufacturing tool 15 tends to be difficult to handle. That is, in a case where the component-manufacturing film 1 is shared while moving between two or more different chuck tables, or the like, it may be necessary to remove the additional layer 13 every time. In contrast, the additional layer 13 made of resin or the additional layer 13 made of metal foil which is sufficiently light in weight and hardly exerts a load on the component-manufacturing film 1 can be shared in a higher level between steps without removing the additional layer 13.

From such a viewpoint, mass of the additional layer 13 per unit area at thickness of 1 mm can be set to 0.1 g/cm² or more and 2.0 g/cm² or less. Further, the mass can be set to 0.2 g/cm² or more and 1.5 g/cm² or less, further 0.3 g/cm² or more and 1.2 g/cm² or less, and further 0.5 g/cm² or more and 1.0 g/cm² or less.

In addition, in a case where a resin is used as the additional layer 13, the tensile elastic modulus $E_{13}'$ of the additional layer 13 is not particularly limited as long as the relationship of "$E_{11}' \leq E_{13}'$" is satisfied; however, the correlation of $E_{11}' \leq E_{13}'$ is preferably established in a higher temperature range. From such a viewpoint, the correlation of $E_{11}' \leq E_{13}'$ is preferably established in the temperature range of 50° C. or higher and 190° C. or lower, is more preferably established in the temperature range of 70° C. or higher and 190° C. or lower, is further preferably established in the temperature range of 90° C. or higher and 190° C. or lower, and is particularly preferably established in the temperature range of 110° C. or higher and 190° C. or lower.

Furthermore, in the temperature range where $E_{13}'$ is 90° C. or higher and 190° C. or lower (furthermore, in the temperature range of 110° C. or higher and 160° C. or lower), the additional layer 13 satisfying $E_{13}' \geq 390$ MPa is preferable, the additional layer 13 satisfying 390 MPa $\leq E_{11}' \leq 5000$ MPa is more preferable, the additional layer 13 satisfying 500 MPa $\leq E_{13}' \leq 4500$ MPa is further preferable, and the additional layer 13 satisfying 800 MPa $\leq E_{11}' \leq 4000$ MPa is particularly preferable.

Note that $E_{13}'$ described in the present Description is preferably in the range described in both the MD direction and the TD direction of the additional layer 13.

Note that the above each tensile elastic modulus $E_{13}'$ regarding the additional layer 13 is measured by a dynamic viscoelasticity measuring device (DMA: Dynamic Mechanical Analysis). Specifically, the tensile elastic modulus $E_{11}'$ is obtained by reading data of each temperature from data obtained by measuring from −50° C. to 200° C. under the measurement conditions of a frequency of 1 Hz and a heating rate of 5° C./min with a sample size of 10 mm in width and the length between chucks of 20 mm.

Moreover, in a case of using inorganic material as the additional layer 13, examples of inorganic material include metal (a metal film, a metal ring or the like), ceramics (a ceramic ring or the like), glass (glass ring or the like), and the like. Among them, metal is preferable from the viewpoint of moldability, easiness of controlling physical properties, and the like.

In addition, examples of the metal include magnesium, titanium, iron, nickel, copper, zinc, palladium, silver, tin, tungsten, platinum, gold, lead, and the like. One of them may be used or two or more of them may be used in combination (alloy or the like).

The thickness of the additional layer 13 is not particularly limited, and can be, for example, 50 μm or more and 2000 ∞m or less, preferably 65 μm or more and 1750 μm or less, and more preferably 80 μm or more and 1500 μm or less.

In particular, in a case of performing an evaluation step using a probe card 80 as a heating step R4 as described later, in order to avoid contact between each part on a measuring device side such as the probe card 80 and the additional layer 13 upon evaluation, it is preferable that the thickness of the additional layer 13 can be limited to thickness not in contact with each part on the measurement device side such as the probe card 80. That is, it is preferable that characteristics can be exhibited in a thinner form.

(3) Another Layer

Although the present component-manufacturing film 1 may be constituted only of the base layer 11, the adhesive layer 12 and the additional layer 13, the present component-manufacturing film 1 may include another layer. Examples of another layer include an unevenness absorption layer capable of absorbing the uneven shape of a sticking surface to make a film surface smooth, an interfacial strength improvement layer improving interfacial strength with the adhesive, and a migration prevention layer suppressing migration of low molecular weight components from a base material to an adhesive surface. One of them may be used or two or more of them may be used in combination.

(4) Manufacturing of Component-Manufacturing Film

The present component-manufacturing film may be manufactured by any method, and the method is not particularly limited. Specifically, present component-manufacturing film can be manufactured by a method such as a co-extrusion method, an extrusion lamination method, an adhesion lamination method, a coating method, or the like. Among them, the co-extrusion method is a method of laminating a molten resin to be the base layer 11 and a molten resin to be the adhesive layer 12 by co-extrusion and manufacturing a foundation layer excluding the additional layer 13 in the component-manufacturing film. Thereafter, the additional layer 13 separately prepared is laminated on the obtained foundation layer, so that the present component-manufacturing film 1 can be obtained.

In addition, the extrusion lamination method is a method of laminating a molten resin to be the adhesive layer 12 on the base layer 11 by extrusion and manufacturing a foundation layer excluding the additional layer 13 in the component-manufacturing film. Also in this case, the additional layer 13 separately prepared is laminated on the obtained foundation layer, so that the present component-manufacturing film 1 can be obtained.

Furthermore, the coating method is a method of laminating a molten resin to be the adhesive layer 12 on the base layer 11 by coating or painting and manufacturing a foundation layer excluding the additional layer 13 in the component-manufacturing film. In the case of using an energy ray-curable adhesive as the adhesive constituting the adhesive layer 12, it is preferable to use this coating method. Also in this coating method, the additional layer 13 separately prepared is laminated on the obtained foundation layer, so that the present component-manufacturing film 1 can be obtained.

In addition, the adhesion lamination method is a method of laminating the base layer 11 and the adhesive layer 12 through thermocompression, an adhesive, hot melt, or the like and manufacturing a semiconductor component-manufacturing film. In this adhesion lamination method, only the base layer 11 and the adhesive layer 12 may be laminated first to form the foundation layer, or the base layer 11, the adhesive layer 12, and the additional layer 13 may be laminated simultaneously to collectively manufacture the present component-manufacturing film 1.

One of these methods may be used or two or more of them may be used in combination.

[2] Component-Manufacturing Tool

A component-manufacturing tool (15) according to the present invention is used in a method of manufacturing a semiconductor component or a method of manufacturing an electronic component.

Figure 4:
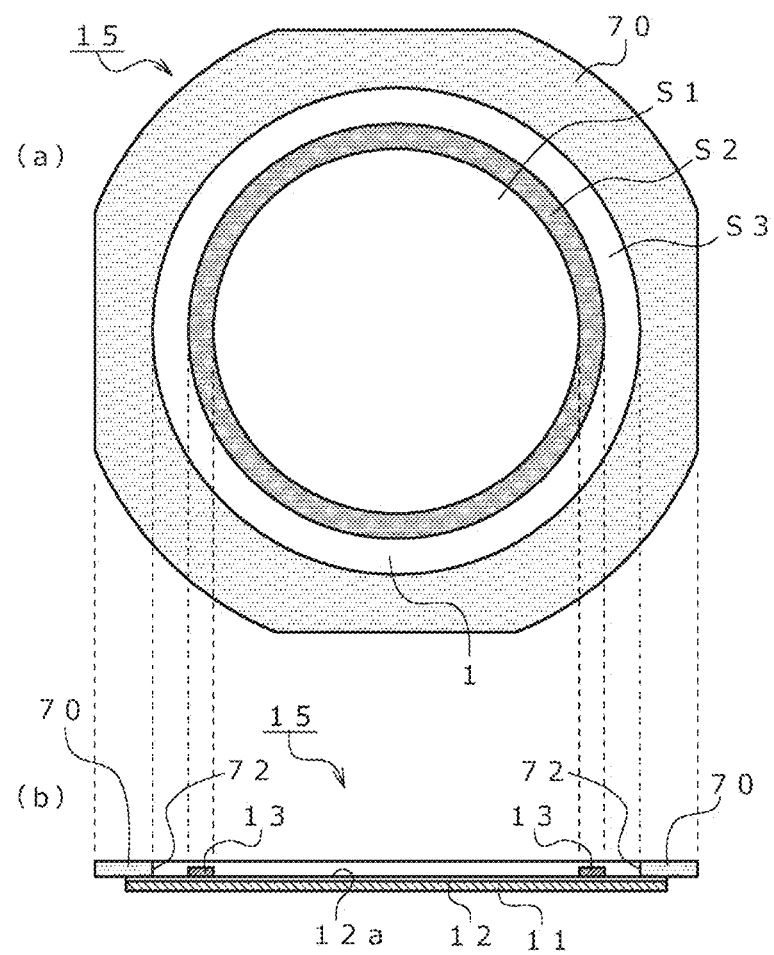
FIG. 4 is an explanatory view for explaining a planar form (a) and a corresponding sectional form (b) of an example of a present component-manufacturing tool.

This component-manufacturing tool (15) includes a frame body (70) having an opening (71), and the component-manufacturing film (1). Then, the component-manufacturing film (1) is fixed to the frame body (70) so that the component-manufacturing film (1) covers the opening (71) and the boundary between the first region (S1) and the second region (S2) is located inside the opening (71) (see FIG. 4).

As described above, since the component-manufacturing film (1) is fixed to the frame body (70) so that the boundary between the first region (S1) and the second region (S2) is located inside the opening (71), the component-manufacturing film (1) can be reliably chucked on the chuck table in a heated environment while having a property of being commonly used in this field enabling shared use in different steps. That is, the component-manufacturing film 1 can be chucked and fixed on the surface 61 of the chuck table 60 without causing chucking failure. In particular, even in a case of selecting flexible material as the base layer 11 and chucking is performed on the heated chuck table 60, chucking failure is not caused.

Furthermore, as mentioned before, in the case where the component-manufacturing film 1 includes the third region S3, the component-manufacturing film 1 is preferably fixed to the frame body 70 so that both the boundary between the first region S1 and the second region S2 and the boundary between the second region S2 and the third region S3 are located inside the opening 71. That is, the component-manufacturing film 1 is preferably fixed to the frame body 70 so that the boundary between the second region S2 and the third region S3 is located inside with respect to the inner peripheral edge of the opening 71 of the frame body 70.

As described above, in the case where the third region S3 is located inside the opening 71, pickup performance can be improved. That is, since the second region S2 includes the additional layer 13 but the third region S3 does not include the additional layer 13, the third region S3 can easily enjoy expandability of the base layer 11 directly. Furthermore, in a case where the third region S3 is located outside the second region S2 and inside with respect to the inner peripheral edge 72 of the opening 71, the third region S3 can be expanded. For example, the frame body 70 can be located below the chuck table 60, and the component-manufacturing film 1 can be spread and pulled. In this case, the first region S1 can be uniformly expanded, and a gap can be formed between components placed in the first region S1 (diced components), and each component can be easily picked up.

As the frame body 70 constituting the component-manufacturing tool 15, for example, a ring frame can be used. The approximate shape of the frame body 70 is not limited, and can be appropriately shaped as needed. For example, a circle, a square, or the like can be adopted. Similarly, the approximate shape of the opening 71 is not limited, and can be appropriately shaped as needed, and for example, a circle, a square, or the like can be adopted. The material constituting the frame body 70 is not limited, and for example, resin and/or metal or the like can be used.

In addition, when the adhesive layer 12 of the electronic component-manufacturing film 1 is affixed to one surface 70a of the frame body 70 so as to cover the opening 71 of the frame body 70, heating may be performed as needed.

[3] Method of Manufacturing Component (1) First Method

The method of the present first invention is a method of method of manufacturing a component (50) using the component-manufacturing film (1). The first method includes a method of manufacturing a semiconductor component (52) and a method of manufacturing an electronic component (54).

Figure 8:
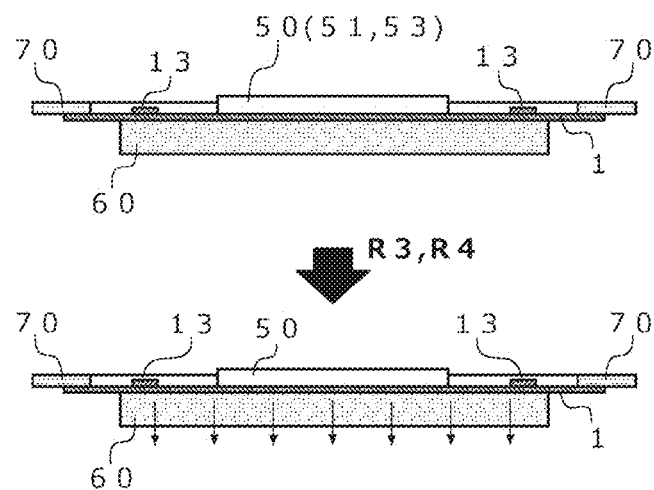
FIG. 8 is an explanatory view for explaining a chucking step and a heating step according to the present method.

The present first method includes:

a component fixing step (R1) (see FIG. 6) of fixing the component (50) in the first region (S1) of the component-manufacturing film (1); a film placement step (R2) (see FIG. 7) of placing the component-manufacturing film (1) to which the component (50) is fixed on a chuck table so that the boundary between the first region (S1) and the second region (S2) is located inside with respect to an edge (62) of a chuck table (60);

a chucking step (R3) (see FIG. 8) of chucking and fixing the component-manufacturing film (1) to which the component (50) is fixed on a surface (61) of the chuck table (60); and a heating step (R4) (see FIG. 8) of heating the component (50) on the component-manufacturing film (1) from a chuck table (60) side through the component-manufacturing film (1) fixed on the chuck table (60).

Among them, the chucking step (R3) and the heating step (R4) can be performed simultaneously. That is, for example, a case where the component-manufacturing film (1) to which the component (50) is fixed is chucked and fixed on the surface (61) of the chuck table (60) heated in advance is assumed.

(2) Second Method

The method of the present second invention is a method of manufacturing a component (50) using the component-manufacturing tool (15). The second method includes a method of manufacturing a semiconductor component (52) and a method of manufacturing an electronic component (54).

The present second method includes:

a component fixing step (R1) (see FIG. 6) of fixing a component (50) in the first region (S1) of the component-manufacturing film (1) exposed from the opening (71) of the component-manufacturing tool (15);

a film placement step (R2) (see FIG. 7) of placing the component-manufacturing tool (15) to which the component (50) is fixed so that a boundary between the first region (S1) and the second region (S2) of the component-manufacturing film (1) is located inside with respect to an edge (62) of a chuck table (60);

a chucking step (R3) (see FIG. 8) of chucking and fixing the component-manufacturing film (1) to which the component (50) is fixed on a surface (61) of the chuck table (60); and a heating step (R4) (see FIG. 8) of heating the component (50) on the component-manufacturing film (1) from a chuck table (60) side through the component-manufacturing film (1) fixed on the chuck table (60).

Among them, the chucking step (R3) and the heating step (R4) can be performed simultaneously. That is, for example, a case where the component-manufacturing film (1) to which the component (50) is fixed is chucked and fixed on the surface (61) of the chuck table (60) heated in advance is assumed.

(3) Component Fixing Step (R1)

In the first method, the component fixing step R1 (FIG. 6) is a step of fixing the component 50 in the first region S1 of the component-manufacturing film 1. In addition, in the second method, the component fixing step R1 is a step of fixing the component 50 in the first region S1 of the component-manufacturing film 1 exposed from the opening 71 of the component-manufacturing tool 15. Although the fixing method is not particularly limited, the adhesive layer 12 of the component-manufacturing film 1 can be affixed and fixed to the back surface of the component 50.

Figure 6:
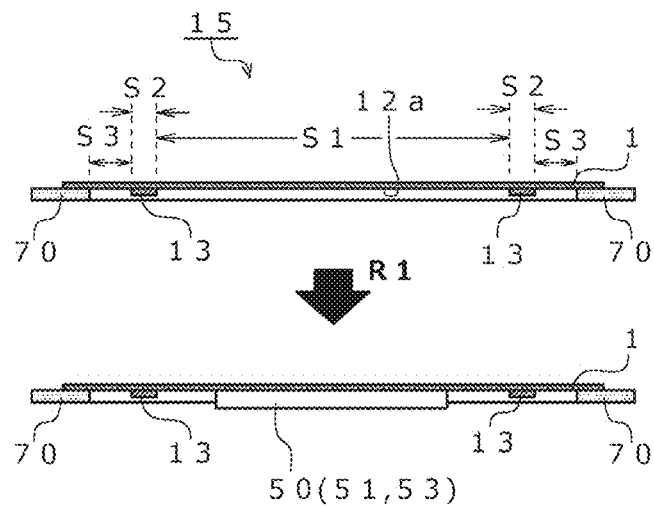
FIG. 6 is an explanatory view for explaining a component fixing step according to the present method.
Figure 7:
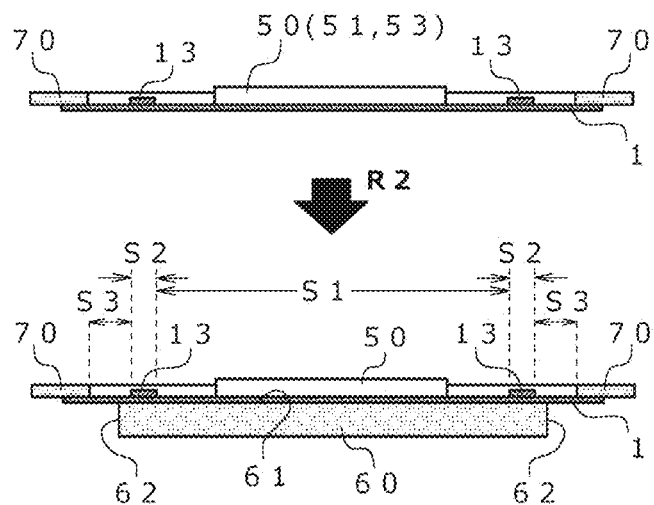
FIG. 7 is an explanatory view for explaining a film placement step according to the present method.

At the time of the above fixing, as illustrated in FIG. 6, the component-manufacturing film 1 is positioned on the upper side and the component 50 is positioned on the lower side so that the component 50 can be affixed onto the surface 12a of the adhesive layer 12 of the component-manufacturing film 1. In addition, as a matter of course, it is possible to reverse the positions thereof to affix them. That is, the component 50 is positioned on the upper side and the component-manufacturing film 1 is positioned on the lower side so that the component 50 can be affixed onto the surface 12a of the adhesive layer 12 of the component-manufacturing film 1. Furthermore, at the time of fixing, heating can be performed as needed.

Note that in the component-manufacturing tool 15, the component-manufacturing film 1 is fixed to the frame body 70 so that the component-manufacturing film 1 covers the opening 71 and the boundary between the first region S1 and the second region S2 is located inside the opening 71. Although the fixing method of the frame body 70 and the component-manufacturing film 1 in this component-manufacturing tool 15 is not limited, the adhesive layer 12 of the component-manufacturing film 1 can be affixed and fixed onto the one surface 70a of the frame body 70. Therefore, in the component fixing step R1, the component 50 can be fixed to the component-manufacturing film 1 and at the same time the component-manufacturing film 1 can be fixed to the frame body 70.

Figure 10:
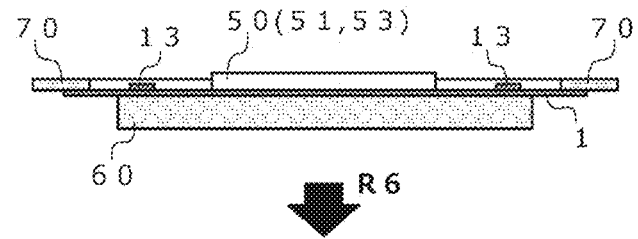
FIG. 10 is an explanatory view for explaining a dividing step according to the present method.

Here, the component 50 includes the semiconductor wafer 51, the semiconductor component 52, the array-shaped electronic component 53, and the electronic component 54. The semiconductor component 52 is a component obtained by dividing the semiconductor wafer 51 (dicing, see FIG. 10). The array-shaped electronic component 53 is a component in which the electronic components 54 before being divided are integrated in an array configuration. That is, the array-shaped electronic component 53 can also be expressed as an electronic component in which a plurality of semiconductor components is sealed in an array configuration. In contrast, the electronic component 54 is a component obtained by dividing the array-shaped electronic component 53 (dicing, see FIG. 10). One electronic component 54 can include one or two or more semiconductor components 52. This dividing can be appropriately performed using a known method.

In addition, dividing may be performed so that at least one semiconductor circuit region is included in one semiconductor component 52, dividing may be performed so that two or more semiconductor circuit regions are included in one semiconductor component 52. Similarly, dividing may be performed so that at least one semiconductor component 52 is included in one electronic component 54, and dividing may be performed so that two or more semiconductor components 52 may be included in one electronic component 54.

Among the components 50, the substrate constituting the semiconductor wafer 51 is not particularly limited, and examples thereof include a silicon substrate, a sapphire substrate, a germanium substrate, a germanium-arsenic substrate, a gallium-phosphorus substrate, a gallium-arsenic-aluminum substrate, and the like. Among them, examples of the semiconductor wafer using the sapphire substrate include a semiconductor wafer in which a semiconductor layer (such as GaN) is laminated on the sapphire substrate. A circuit is usually formed on the surface of such semiconductor wafers. Examples of this circuit include wiring, a capacitor, a diode, a transistor, and the like. One of them may be used or two or more of them may be used in combination.

In addition, among the components 50, the array-shaped electronic component 53 is one in which the semiconductor components 52 are sealed in an array configuration. Specifically, the electronic components 54 of the following forms (1) to (3) are included.

Form (1) is an array-shaped electronic component 53 obtained by arraying semiconductor components 52 (chips, dies) obtained by dividing the semiconductor wafer 51 on which circuits are formed on a lead frame, wire-bonding them, and then sealing them with a sealant 57.

Form (2) is an array-shaped electronic component 53 obtained by separately arraying semiconductor components 52 (chips, dies) obtained by dividing the semiconductor wafer 51 on which circuits are formed, sealing them with a sealant 57, and collectively forming an external circuit 59 which obtains conduction with outside such as a rewiring layer and a bump electrode. That is, form (2) is the array-shaped electronic component 53 obtained by a fan-out method (eWLB method).

Form (3) is an array-shaped electronic component 53 obtained by using a semiconductor wafer 51 as a semiconductor component 52 in a state of a wafer and collectively forming an external circuit 59 which obtains conduction with outside such as a rewiring layer and a bump electrode and a sealing layer 57 sealed with a sealant 57. The semiconductor wafer 51 in form (3) includes a form in a state before being divided, where the semiconductor components 52 (chips, dies) are formed in an array configuration, or using the semiconductor wafer 51 as a substrate (form of joining chips having circuits on a non-circuit silicon substrate and using the same) and the like. That is, the array-shaped electronic component 53 in form (3) is an array-shaped electronic component obtained in a wafer-level chip size package (WLCSP) method.

Note that also when the electronic component 54 of form (2) is manufactured, the present component-manufacturing film 1 can be used. Specifically, the array-shaped electronic component 53 can be obtained by separately arraying semiconductor components 52 on the component-manufacturing film 1, sealing them with a sealant 57 and collectively forming an external circuit 59 which obtains conduction with outside such as a rewiring layer and a bump electrode.

(4) Film Placement Step (R2)

In the first method, the film placement step R2 (FIG. 7) is a step of placing the component-manufacturing film 1 to which the component 50 is fixed on the chuck table 60 so that the boundary between the first region S1 and the second region S2 is located inside with respect to the edge 62 of the chuck table 60.

In addition, in the second method, the film placement step R2 is a step of placing the component-manufacturing tool 15 to which the component 50 is fixed on the chuck table 60 so that the boundary between the first region S1 and the second region S2 of the component-manufacturing film 1 is located inside with respect to the edge 62 of the chuck table 60.

In this step, as mentioned before, in a case where the component-manufacturing film 1 includes the third region S3, also the boundary between the second region S2 and the third region S3 is preferably located inside with respect to the edge 62 of the chuck table 60.

As described above, since the boundary between the first region S1 and the second region S2 is located inside with respect to the edge 62 of the chuck table 60, the component-manufacturing film 1 can be normally chucked on the chuck table 60. Although the mechanism of this chucking is not clear, it is considered that if the boundary between the first region S1 and the second region S2 is located inside with respect to the edge 62 of the chuck table 60, the second region S2 which has the additional layer 13 having the tensile elastic modulus when heated is equal to that of the base layer 11 or greater than that of the base layer 11 can function as a chucking start point. That is, it can be considered that the second region S2 having a relatively low decrease in elasticity at high temperature is first chucked normally, suction failure from the first region S1 surrounded by the second region S2 is prevented, and the first region S1 can also be chucked normally.

(5) Chucking Step (R3)

The chucking step R3 (see FIG. 8) in the first method and the second method is a step of chucking and fixing the component-manufacturing film 1 to which the component 50 is fixed on the surface 61 of the chuck table 60.

This chucking step R3 can be performed simultaneously with the heating step R4. That is, for example, a case of chucking and fixing the component-manufacturing film 1 to which the component 50 is fixed on the surface 61 of the chuck table 60 heated in advance, a case where the chucking step R3 and the heating step R4 are alternately performed and chucking of the component-manufacturing film 1 is performed before the surface 61 of the chuck table 60 is sufficiently cooled, and the like can be assumed.

Here, the chuck table 60 can be used without limitation as long as the chuck table 60 is a jig capable of chucking the present component-manufacturing film. Usually, the chuck table 60 is a jig having a chucking surface capable of chucking the present component-manufacturing film. In addition, it is preferable that the chuck table 60 has a suction means separately installed and the component-manufacturing film can be held in the state of being chucked on the chucking surface by a suction operation from the chucking means. Specifically, a dense body having a chucking surface and a suction route configured of a groove and/or hole in the chucking surface, a porous body that can perform sucking, or the like is used as the above-described chucking surface. Such a suction surface is usually a plane.

(6) Heating Step (R4)

The heating step R4 (see FIG. 8) in the first method and the second method is a step of heating the component 50 on the component-manufacturing film 1 through the component-manufacturing film 1 fixed on the chuck table 60 from a chuck table 60) side.

Although the purpose of heating in this heating step R4 is not limited, for example, heating when evaluating the component 50 can be assumed. That is, examples of the heating include heating in the evaluation step (See FIGS. 9, 11) of evaluating the components 50. That is, evaluation of the component 50 includes evaluation of the semiconductor wafer 51, evaluation of the semiconductor component 52, evaluation of the array-shaped electronic component 53, evaluation of the electronic component 54, and the like.

Figure 9:
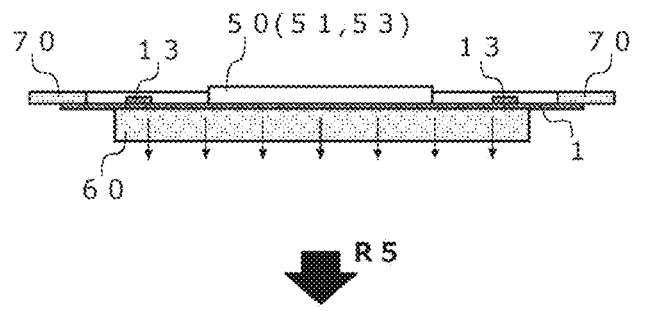
FIG. 9 is an explanatory view for explaining an evaluation step according to the present method.
Figure 9:
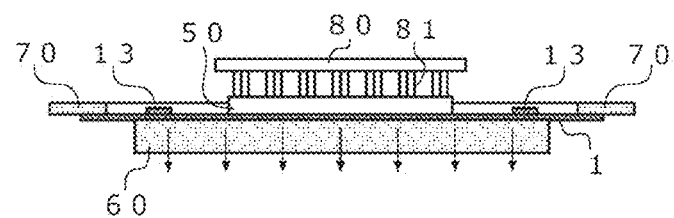

Among them, the evaluation of the semiconductor wafer 51 includes evaluating, using a prober, whether or not the electrical characteristics of the plurality of circuits (corresponding to circuits of respective semiconductor components) formed on the semiconductor wafer 51 can exhibit desired characteristics in a predetermined temperature region (for example, 0° C. or lower or 100° C. or higher) in a state where the semiconductor wafer 51 is fixed on the component-manufacturing film 1 (see FIG. 9).

Figure 11:
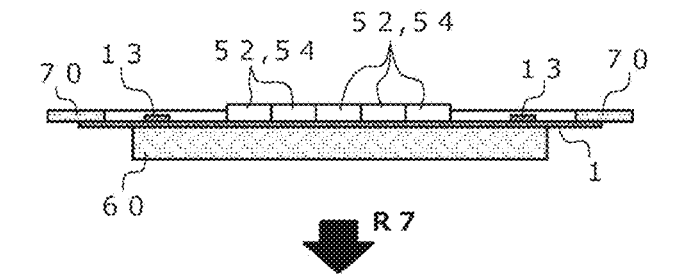
FIG. 11 is an explanatory view for explaining an evaluation step according to the present method.
Figure 11:
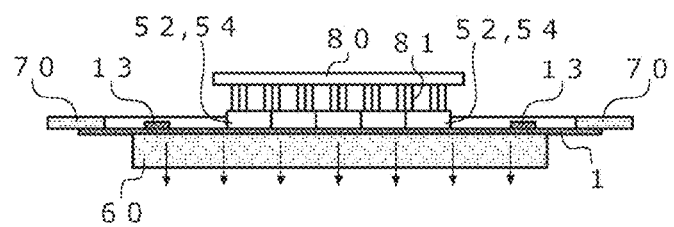

In addition, the evaluation of the semiconductor component 52 includes evaluating, using a prober, whether or not the electrical characteristics of the plurality of semiconductor components 52 obtained by dividing the semiconductor wafer 51 can exhibit desired characteristics in a predetermined temperature region (for example, 0° C. or lower or 100° C. or higher) in a state where these semiconductor components 52 is arrayed and fixed on the component-manufacturing film 1 in an array configuration (see FIG. 11).

These respective evaluations include one for the purpose of operation check in each of the above temperature regions and one for the purpose of an accelerated endurance test in each of the above temperature regions (for example, a burn-in test).

Specifically, for example, a probe card 80 on which a plurality of probes 81 are formed is brought into contact with a predetermined corresponding portion of each component 50 such as the semiconductor wafer 51 or the semiconductor component 52 to make electrical connection, so that correctness of the signal exchanged between the probe 81 and the circuit formed on each component 50 is judged (probe test) (see FIGS. 9 and 11).

In addition, in the case of using the component-manufacturing film 1 fixed to the frame body 70 of the component-manufacturing tool 15, in order to avoid contact between the frame body 70 and each part on a measuring device side such as the probe card 80, it is preferable that jigs such as the chuck table 60 and a stopper 91 are disposed inside the frame body 70, and the frame body 70 is pushed downward (for example, 0.5 to 15 mm) so that the frame body 70 is separated from the measuring device such as the probe card 80.

Examples of these evaluations include a non-contact optical evaluation in addition to an electrical evaluation (probe test) performed by bringing a probe into contact as described above.

Furthermore, the evaluation of the array-shaped electronic component 53 includes evaluating, using a prober, whether or not the electrical characteristics of each internal circuit included in the array-shaped electronic component 53 and external circuits (circuits for leading the respective internal circuits to the outside) formed correspondingly to these internal circuits can exhibit desired characteristics in a predetermined temperature region (for example, 0° C. or lower or 100° C. or higher) in a state where the array-shaped electronic component 53 is fixed on the component-manufacturing film 1 in an array configuration (see FIG. 9).

In addition, the evaluation of the electronic component 54 includes evaluating, using a prober, whether or not the electrical characteristics the plurality of respective electronic components obtained by dividing the array-shaped electronic component 53 can exhibit desired characteristics in a predetermined temperature region (for example, 0° C. or lower or 100° C. or higher) in a state where the plurality of electronic components is arrayed and fixed on the present component-manufacturing film 1 in an array configuration (see FIG. 11).

These respective evaluations include one for the purpose of operation check in each of the above temperature regions and one for the purpose of an accelerated endurance test in each of the above temperature regions (for example, a burn-in test).

Specifically, for example, the probe card 80 on which the plurality of probes 81 is formed is brought into contact with a predetermined corresponding portion of each component 50 such as the array-shaped electronic component 53 and the electronic component 54 to make electrical connection, so that whether correctness of the signal exchanged between the probe 81 and the external circuit formed on the array-shaped electronic component 53 can be judged (probe test) (see FIGS. 9 and 11).

In addition, in the case of using the component-manufacturing film 1 fixed to the frame body 70 of the component-manufacturing tool 15, in order to avoid contact between the frame body 70 and each part on a measuring device side such as the probe card 80, it is preferable that jigs such as the chuck table 60 and a stopper 91 are disposed inside the frame body 70, and the frame body 70 is pushed downward (for example, 0.5 to 15 mm) so that the frame body 70 is separated from the measuring device such as the probe card 80.

Figure 12:
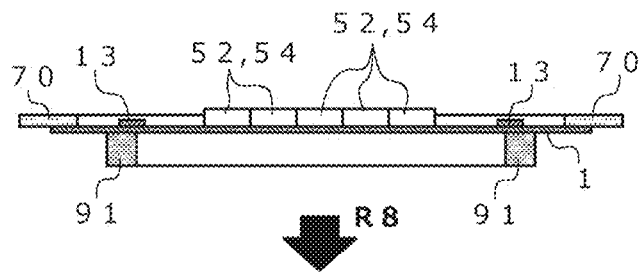
FIG. 12 is an explanatory view for explaining a component separation step according to the present method.
Figure 12:
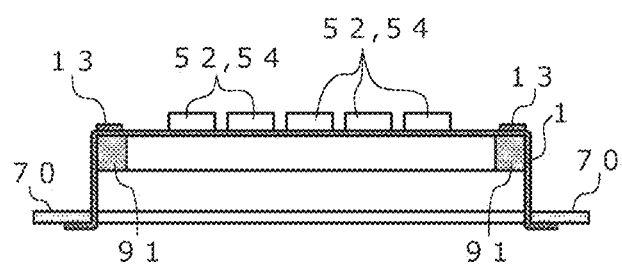

In the heating step R4, on a high-temperature side, even if evaluation is performed at, for example, 100° C. or higher and 170° C. or lower (further 110° C. or higher and 170° C. or lower, and particularly 120° C. or higher and 160° C. or lower), the component-manufacturing film 1 can maintain flexibility required for evaluation. Furthermore, the component-manufacturing film 1 having no trouble in the pickup step (see FIG. 13) can be made. That is, the component-manufacturing film maintains flexibility even when pushed up by a push-up member 92 in the pickup step, and the component-manufacturing film 1 can be pushed up without being broken. In particular, in a case where a component separation step (see FIG. 12) is provided before the pickup step (see FIG. 13), the component-manufacturing film 1 is more likely to be broken; however, by using the aforementioned component-manufacturing film 1, it is possible to prevent breakage and pickup smoothly.

The above-described manufacturing method can include another step in addition to the component fixing step R1, the film placement step R2, the chucking step R3, and the heating step R4.

Figure 13:
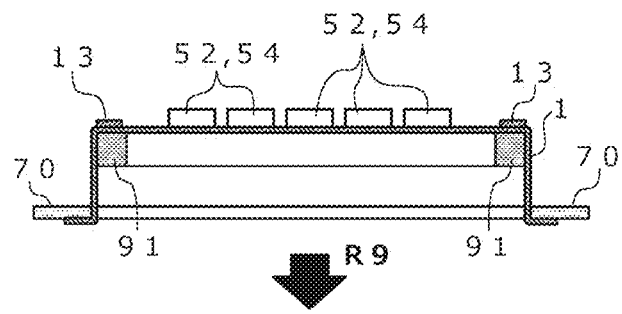
FIG. 13 is an explanatory view for explaining a pickup step according to the present method.
Figure 13:
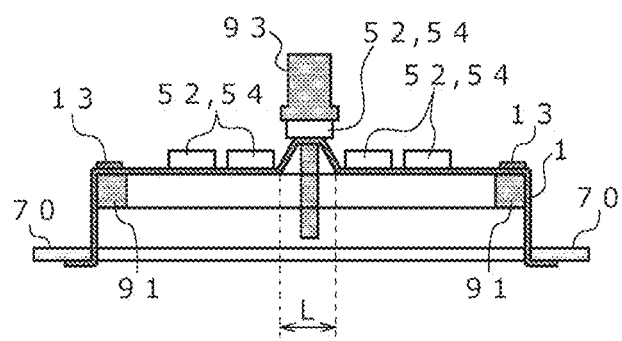

Examples of another step include the dividing step (see FIG. 10), the component separation step (see FIG. 12), and the pickup step (see FIG. 13). One of them may be used or two or more of them may be used in combination.

Among them, the dividing step (see FIG. 10) is a step of cutting the semiconductor wafer 51 into pieces so as to be semiconductor components 52 or cutting the array-shaped electronic component 53 into pieces so as to be electronic components 54. This dividing can be appropriately performed using a known method.

In addition, the component separation step (see FIG. 12) is a step of expanding at least the first region S1 and separating the divided components 50 (semiconductor components 52, electronic components 54) on the first region S1 by expanding the component-manufacturing film 1 in the outer peripheral direction thereof. The component-manufacturing film 1 can be expanded, for example, by bringing the stopper 91 into contact with the inside of the frame body 70.

Furthermore, the pickup step (see FIG. 13) is a step of separating the divided components 50 (semiconductor components 52, electronic components 54) from the adhesive layer 12 of the component-manufacturing film 1. Flexibility of the present component-manufacturing film 1 can be maintained throughout the respective steps, so that the present component-manufacturing film 1 can have high pickup performance. Specifically, it is possible to deform only a portion of the film where a component to be picked up is affixed in the pickup step. That is, it is possible to reduce the area of the peripheral film pushed up following pushing up by the push-up member 92, and to shorten the diameter L (see FIG. 13) of a circular portion lifted as the film is pushed up. As a result, it is possible to prevent problems such as unintended lifting of a component not to be picked up. In a film that cannot maintain sufficient flexibility, since the area of the peripheral film that is unintentionally lifted as the film is pushed up is large, there is fear of occurrence of problems such as collision of components caused by simultaneous or inclined lifting of another component (component not to be picked up) adjacent to the component to be picked up. Such a problem can be prevented with the present component-manufacturing film 1.

The pickup step can be appropriately performed using a known method, and for example, can be performed by pushing up the component 50 to be picked up with the push-up member 92 from a side of the base layer 11 of the component-manufacturing film 1 and picking up the pushed-up component 50 with a pickup tool 93 by a method such as chucking.

Note that in a case where the additional layer 13 is affixed to the adhesive layer 12 in a state of being able to be removed as appropriate, the above component separation step and the pickup step can also be performed by removing the additional layer 13 from the component-manufacturing film 1.

In addition, although not included in the present invention, similar functions and effect can be obtained by the mechanism similar to that of the present invention even in component-manufacturing films of the following forms.

Figure 14:
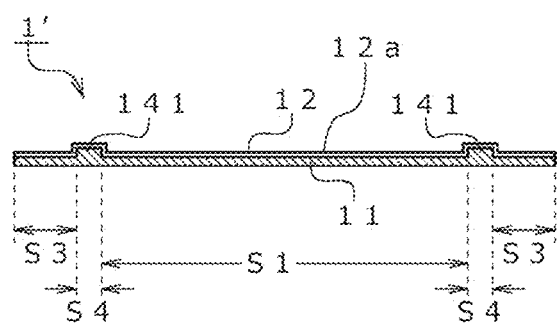
FIG. 14 is illustration of a component-manufacturing film not included in the present invention.

Examples of the component-manufacturing films include a component-manufacturing film 1' of a form in which a thick film region 141 where part of the base layer 11 is formed thicker than the first region S1 and the thick film region 141 forms a region S4, as illustrated in FIG. 14. In this component-manufacturing film 1', it is possible to make a portion formed thicker than the other part of the base layer 11 function similarly to the additional layer 13 of the present component-manufacturing film 1, and to make the region S4 function similarly to the second region S2 of the present component-manufacturing film 1.

Figure 15:
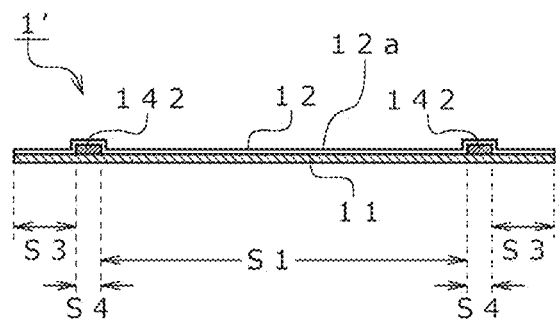
FIG. 15 is illustration of a component-manufacturing film not included in the present invention.

Furthermore, as illustrated in FIG. 15, a component-manufacturing film 1' has a region S4, and the region S4 is formed of a layer (separate layer) 142 different from a base layer 11 similarly to the present component-manufacturing film 1. However, the component-manufacturing film 1' differs in that an adhesive layer 12 is provided on an upper side of the separate layer 142. In this component-manufacturing film 1', it is possible to make the separate layer 142 function similarly to the additional layer 13 of the present component-manufacturing film 1, and to make the region S4 function similarly to the second region S2 of the present component-manufacturing film 1.

Figure 16:
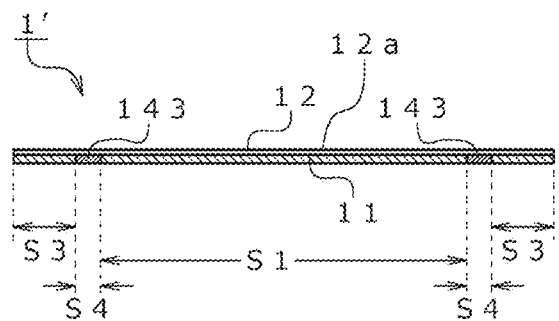
FIG. 16 is illustration of a component-manufacturing film not included in the present invention.

In addition, as illustrated in FIG. 16, a component-manufacturing film 1' has a region S4, and the region S4 is formed of a layer (separate layer) 143 different from a base layer 11 similarly to the present component-manufacturing film 1. However, the component-manufacturing film 1' differs in that the separate layer 143 is embedded in part of the base layer 11 (or part of the base layer 11 is formed of another material that functions as the different separate layer 143). In this component-manufacturing film 1', it is possible to make the separate layer 143 function similarly to the additional layer 13 of the present component-manufacturing film 1, and to make the region S4 function similarly to the second region S2 of the present component-manufacturing film 1.

EXAMPLES

Hereinafter, the present invention will be specifically described by way of examples.

[1] Manufacturing of Component-Manufacturing Film

Example 1

(1) Base Layer

A polyester-based thermoplastic elastomer (TPEF) film with a thickness of 80 μm (manufactured by Du pont-Toray Co., Ltd., article name "Hytrel 4777", with a thermal expansion coefficient of 220 ppm/K at temperature of 50 to 200° C. and melting point of 200° C.) was used as the base layer 11.

This base layer 11 was used to measure the tensile elastic modulus $E_{11}$ by a dynamic viscoelasticity measuring device (DMA: Dynamic Mechanical Analysis) (product name: RSA-3, manufactured by TA Instruments, Inc.). Specifically, data of each temperature was read from data obtained by measuring from −50° C. to 200° C. under the measurement conditions of a frequency of 1 Hz and a heating rate of 5° C./min with a sample size of 10 mm in width and the length between chucks of 20 mm. That is, the value at −40° C. was set as the tensile elastic modulus E' (−40), and the value at 160° C. was set as the tensile elastic modulus E'(160). As a result, E'(−40) was 440 MPa and E'(160) was 12 MPa. As a result, the ratio $R_E(=E'(160)/E'(-40))$ was 0.03.

(2) Adhesive Layer

As the adhesive layer 12, a non-curable acrylic adhesive with a thickness of 10 μm was used.

(3) Lamination of Base Layer and Adhesive Layer

The adhesive layer 12 of the above (2) was laminated on one surface of the base layer 11 obtained in the above (1).

(4) Lamination of Additional Layer

A polyethylene terephthalate (PET) film (manufactured by Toray Industries, Inc., article name "Lumirror", with a thermal expansion coefficient of 15 ppm/K at temperature of 50 to 190° C. and melting point of 258° C.) with a thickness of 50 μm was used as the additional layer 13 (shape thereof was the ring shape illustrated in FIG. 1) was affixed to the surface 12*a* of the adhesive layer 12 obtained up to the above (3), and the component-manufacturing film 1 of Example 1 was obtained.

Note that regarding the tensile elastic modulus (160° C.) of this additional layer 13, E'(160) was 400 MPa measured similarly to the case of the base layer 11.

Example 2

(1) Lamination of Additional Layer

The following additional layer 13 was laminated on a laminate obtained in a similar manner up to <Example 1>(3).

A stainless (SUS 304) sheet (a thermal expansion coefficient of 10 ppm/K at temperature of 50 to 190° C.) with a thickness of 300 μm was used as the additional layer 13 (shape thereof was a ring shape illustrated in FIG. 1) and the component-manufacturing film 1 of Example 2 was obtained.

Note that regarding the tensile elastic modulus (160° C.) of this additional layer 13, E'(160) was $185\times10^3$ MPa measured similarly to the case of the base layer 11.

Comparative Example 1

A laminate of a base layer 11 and an adhesive layer 12 obtained in a similar manner as in Example 1 and Example 2 except that an additional layer 13 was not used was used as a component-manufacturing film 1 of Comparative Example 1 (that is, a conventional component-manufacturing film without the additional layer 13).

[3] Effect of Examples

By providing the additional layer 13, even the chuck table 60 heated to 160° C. was able to chuck and fix the component-manufacturing film 1.

Note that the present invention is not limited to the above specific examples but can be variously modified within the scope of the present invention depending on the purpose and use.

INDUSTRIAL APPLICABILITY

The component-manufacturing film, the component-manufacturing tool, and the method of manufacturing a component of the present invention are widely used in applications of semiconductor-component manufacturing and electronic-component manufacturing. In particular, in the case of using a method of manufacturing a component including an evaluation step accompanying heating, a dividing step, and a pickup step, since the component-manufacturing film, the component-manufacturing tool, and the method of manufacturing a component of the present invention are suitably used for component manufacturing excellent in productivity due to their characteristics of enabling reliable chucking to a chuck table in a heated environment while having a property of being commonly used in this field enabling shared use in different steps.

REFERENCE SIGNS LIST

1 Component-manufacturing film
11 Base layer
12 Adhesive layer
12*a* Surface of adhesive layer (Surface of adhesive layer 12 exposed to opening 71)
13 Additional layer

TABLE 1

| | Base layer | | | Additional layer | | | |
|---|---|---|---|---|---|---|---|
| | Material | $E_{11}'$ (160) (MPa) | Thermal expansion coefficient (ppm/K) | Material | $E_{13}'$ (160) (MPa) | Correlation of E' | Evaluation |
| Comparative Example 1 | TPEE | 12 | 220 | None | — | — | x |
| Example 1 | TPEE | 12 | 220 | PET | 400 | $E_{11}' < E_{13}'$ | Δ |
| Example 2 | TPEE | 12 | 220 | SUS | $185 \times 10^3$ | $E_{11}' < E_{13}'$ | o |

[2] Test Using Component-Manufacturing Film

The following test was performed using Examples 1-2 and Comparative Example 1.

(1) Test 1 (Heat Resistance Evaluation)

The base layer 11 of each of the component-manufacturing films of Examples 1-2 and Comparative Example 1 obtained in the above [1] was chucked and fixed on a vacuum chucking type chuck table set at temperature of 120° C. The chucking and fixation states at this time were evaluated according to the following criteria, and the results are indicated in Table 1.

"o": well chucked and fixed.

"Δ": was able to be chucked and fixed but a slight wrinkle was observed in the third region S3.

"x": component-manufacturing film was corrugated and was not able to be chucked and fixed.

131 Individual additional layer
15 Component-manufacturing tool
50 Component
51 Semiconductor wafer
52 Semiconductor component
53 Array-shaped electronic component
54 Electronic component
57 Sealant (Sealing material, sealing layer)
59 External circuit
60 Chuck table
61 Surface (Surface of chuck table capable of performing chucking)
62 Edge (Edge of chuck table)
70 Frame body
70*a* One surface of frame body
71 Opening of frame body
72 Inner peripheral edge of opening of frame body
80 Probe card 81 Probe
91 Stopper
92 Push-up member
93 Pickup tool
S1 First region
S2 Second region
S21 Individual region
S3 Third region
R1 Component fixing step
R2 Film placement step
R3 Chucking step
R4 Heating step
R5 Evaluation step (Semiconductor wafer evaluation step, Array-shaped electronic component evaluation step)
R6 Dividing step
R7 Evaluation step (Semiconductor component evaluation step, Electronic component evaluation step)
R8 Component separation step
R9 Pickup step

The invention claimed is:

1. A component-manufacturing film used in a method of manufacturing a semiconductor component or a method of manufacturing an electronic component, the component-manufacturing film comprising:
    a first region; and
    a second region disposed so as to surround the first region,
    wherein the first region is formed of a base layer and an adhesive layer provided on one surface side of the base layer,
    wherein the second region is formed of the base layer, the adhesive layer, and an additional layer affixed onto the adhesive layer, and
    wherein a tensile elastic modulus of the additional layer is equal to a tensile elastic modulus of the base layer or greater than the tensile elastic modulus of the base layer at a temperature range of 190° C. or lower.

2. The component-manufacturing film according to claim 1, wherein a linear thermal expansion coefficient of the base layer is 100 ppm/K or more.

3. The component-manufacturing film according to claim 1, wherein the base layer includes at least one of a material selected from the group consisting of a thermoplastic polyester-based elastomer, a thermoplastic polyamide-based elastomer, and polybutylene terephthalate.

4. The component-manufacturing film according to claim 1, wherein the additional layer is made of at least one of a material selected from the group consisting of metal, resin, ceramics, and glass.

5. The component-manufacturing film according to claim 1 further comprising a third region disposed so as to surround the second region, the third region being formed of the base layer and the adhesive layer.

6. A component-manufacturing tool used in a method of manufacturing a semiconductor component or a method of manufacturing an electronic component, the component-manufacturing tool comprising:
    a frame body having an opening and the component-manufacturing film according to claim 1,
    wherein the component-manufacturing film is fixed to the frame body so that the component-manufacturing film covers the opening and a boundary between the first region and the second region is located inside the opening.

7. A method of manufacturing a component selected from a semiconductor component and an electronic component, the method comprising:
    a component fixing step of fixing the component in the first region of the component-manufacturing film according to claim 1;
    a film placement step of placing the component-manufacturing film to which the component is fixed on a chuck table so that a boundary between the first region and the second region is located inside with respect to an edge of the chuck table;
    a chucking step of chucking and fixing the component-manufacturing film to which the component is fixed on a surface of the chuck table; and
    a heating step of heating the component on the component-manufacturing film from a side of the chuck table through the component-manufacturing film fixed on the chuck table.

8. A method of manufacturing a component selected from a semiconductor component and an electronic component, the method comprising:
    a component fixing step of fixing the component in the first region of the component-manufacturing film exposed from the opening of the component-manufacturing tool according to claim 6;
    a film placement step of placing the component-manufacturing tool to which the component is fixed on a chuck table so that a boundary between the first region and the second region of the component-manufacturing film is located inside with respect to an edge of the chuck table;
    a chucking step of chucking and fixing the component-manufacturing film to which the component is fixed on a surface of the chuck table; and
    a heating step of heating the component on the component-manufacturing film from a side of the chuck table through the component-manufacturing film fixed on the chuck table.

* * * * *